United States Patent [19]

Takeno

[11] Patent Number: 4,573,101

[45] Date of Patent: Feb. 25, 1986

[54] LC COMPOSITE COMPONENT

[75] Inventor: Seiichi Takeno, Fukui, Japan

[73] Assignee: Murata Manufacturing Co., Ltd., Japan

[21] Appl. No.: 624,024

[22] Filed: Jun. 25, 1984

[30] Foreign Application Priority Data

Jun. 28, 1983 [JP] Japan ............................. 58-99827[U]

[51] Int. Cl.⁴ .......................... H01G 4/10; H01G 4/38
[52] U.S. Cl. ..................................... 361/321; 361/328
[58] Field of Search ....................... 361/320, 321, 328; 357/40, 51, 80, 81

[56] References Cited

U.S. PATENT DOCUMENTS

| | | | |
|---|---|---|---|
| 3,022,472 | 2/1962 | Tanenbaum et al. | 357/51 X |
| 3,716,759 | 2/1973 | Scace et al. | 357/81 X |
| 3,721,871 | 3/1973 | Heron | 361/321 X |
| 4,353,047 | 10/1982 | Noguchi et al. | 361/321 X |
| 4,458,294 | 7/1984 | Womack | 361/321 |
| 4,470,099 | 9/1984 | Sawairi | 361/328 |

Primary Examiner—Donald A. Griffin
Attorney, Agent, or Firm—Ostrolenk, Faber, Gerb & Soffen

[57] ABSTRACT

A chip-type LC composite component in which an inductance element section (51) for producing an inductance component is superposed on a laminated capacitor section (34) for producing a capacitance component. Conductive paths (39, 40, 42, 43, 45, 46, 48, 49) included in the inductance element section (51) extend between outer electrodes (31, 33) of the laminated capacitor section (34). The inductance element (51) includes a laminated substance comprising a plurality of layers (39, 41, 44, 47, 50) obtained by firing paste containing powder of sintered ferrite, glass frit and organic binder and solidifying the same. The conductive paths (39, 40, 42, 43, 45, 46, 48, 49) included in the inductance element section (51) include conductive patterns formed on the respective layers of the laminated substance extending so as to produce an inductance component.

16 Claims, 33 Drawing Figures

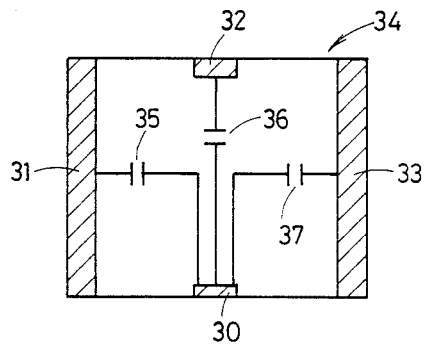
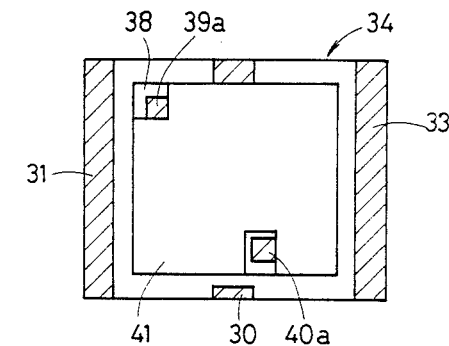
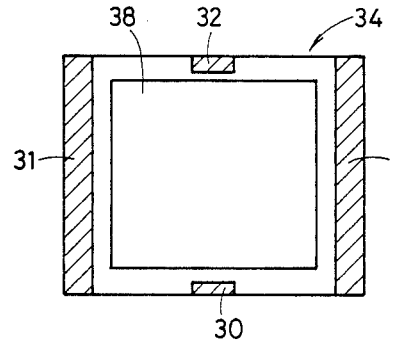
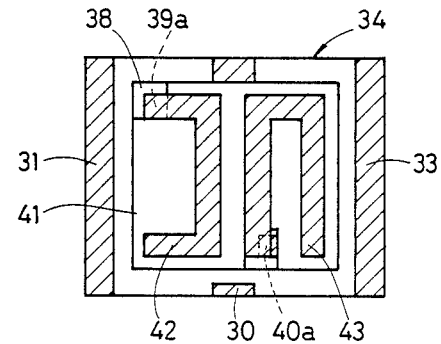
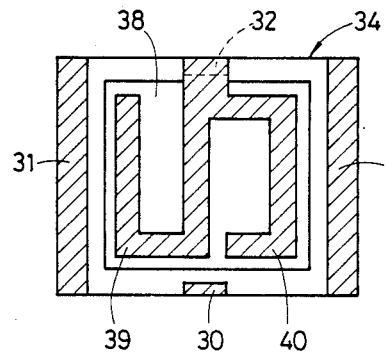
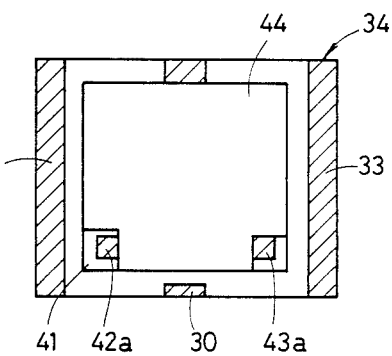

LC COMPOSITE COMPONENT

BACKGROUND OF THE INVENTION

The present invention relates to an LC composite component, and more particularly, it relates to a chip-shaped LC composite component.

An LC composite component including inductance elements and capacitance elements is utilized as, e.g., a filter. FIG. 1 is a connection diagram of a double-pi type filter, shown as a typical example of such an LC composite component.

The double-pi type filter comprises three terminals 1, 2 and 3, in which two inductance elements 4 and 5 are connected in series between the terminals 1 and 2, and three capacitance elements 6, 7 and 8 connected in parallel to the terminal 3 are coupled with the terminal 1, the junction between the inductance elements 4 and 5 and the terminal 2 respectively.

For obtaining such a double-pi type filter as one component, discrete components have heretofore been assembled, for example, as shown in FIG. 2. Namely, in FIG. 2, three electrodes 10, 11 and 12 are arranged on one side surface of a ceramic dielectric sheet 9 while an electrode 13 commonly opposite to the above respective electrodes 10, 11 and 12 is formed on the other side surface of the same, thereby to form the capacitance elements 6, 7 and 8 shown in FIG. 1. Then, coil elements 14 and 15 corresponding to the inductance elements 4 and 5 in FIG. 1 are connected between the electrodes 10 and 11 and between the electrodes 11 and 12 respectively by soldering. Thereafter externally drawn-out lead wires 16, 17 and 18 are respectively mounted on the electrodes 10, 12 and 13, to implement the respective electrodes 1, 2 and 3 in FIG. 1. Finally, the component thus assembled is coated by armoring resin (not shown) except edges for drawing out the lead wires 16, 17 and 18.

However, such an LC composite component forming the double-pi type filter as shown in FIG. 2 is inevitably made large-sized since the same is constructed as one component by simply assembling discrete components, leading to requirement of a large occupied volume in mounting of the same to a circuit board. Further, since the assembled component is a lead type, it has been difficult to automatically mount the same onto the circuit board.

SUMMARY OF THE INVENTION

Accordingly, an essential object of the present invention is to provide an LC composite component which is so chip-shaped as to be small-sized, and which is relatively readily applicable to mass production.

According to the present invention, there is provided an LC composite component which comprises a laminated or multi-layer capacitor section provided with at least two outer electrodes formed on an end surface thereof at positions different from each other, an inductance element section superposed on the laminated capacitor section and a conductive path formed within the inductance element section, which conductive path extends from a predetermined outer electrode of the laminated capacitor section. The inductance element section includes a laminated substance comprising a plurality of layers obtained by solidifying paste containing sintered powder of magnetic or insulating material and the conductive path includes a plurality of conductive patterns formed on the layers of the aforementioned laminated substance of plurality of layers, and the plurality of conductive patterns extend within the inductance element section such that certain layers of the laminated substance are laminated in a state exposing end terminals of the conductive patterns arranged under the same, which conductive patterns in turn are conductively connected with the other conductive patterns formed on the subject certain layers at the exposed faces, thereby to form an inductance component.

According to the present invention, there can be obtained various forms of LC composite components, and various modifications may be carried out with respect to the numbers of inductance elements and capacitance elements included therein and the mode of connection of the respective inductance elements and the respective capacitance elements.

Since, according to the present invention, the laminated capacitor section and the inductance element section are so superposed that outer electrodes can desiredly be provided on the outer surface of the superposed substance, there can be obtained a chip-shaped LC composite component. Consequently, the occupied volume of the LC composite component on a circuit board may be made small, to facilitate implementation in a small size of a device to which such an LC composite component is applied and ready automatic assembling thereof. Further, since the laminated substance constituting the inductance element section is obtained by solidifying paste containing sintered powder of magnetic or insulating ceramic material, there is no need to sinter the same in a controlled condition under a high temperature of, e.g., over 1000° C., and thus an inductance element section having stable efficiency can be obtained by simply firing the laminated substance in an uncomplicated equipment at a low temperature for a short time. In addition, the metallic material for forming the conductive patterns provided in the inductance element section need not be selected from expensive noble metals resistant to a high temperature. Further, such firing at a low temperature for a short time will not exert any harmful influence on the laminated capacitor section, and thus the characteristic of the laminated capacitor section is not affected by superposition of the inductance element section thereon. Since, further, the steps for obtaining the LC composite component of the present invention are based on conventional laminated capacitor manufacturing technique and thick film printing technique, the LC composite component may relatively readily be applied to mass production.

The above and other objects, features, aspects and advantages of the present invention will become more apparent from the following detailed description of the present invention when taken in conjunction with the accompanying drawings.

BRIEF DESCRIPTION OF THE DRAWINGS

FIGS. 3 through 16 are illustrations of an embodiment of the present invention, in which steps for obtaining a double-pi type filter are shown in order;

DESCRIPTION OF THE PREFERRED EMBODIMENTS

Figure 1:
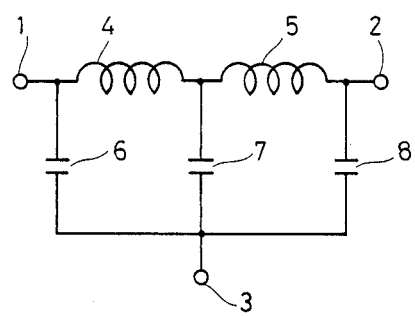
FIG. 1 is a connection diagram of a double-pi type filter to be implemented by an LC composite component.

In FIGS. 3 through 16, there are shown steps for obtaining an embodiment of the present invention in order. The present embodiment is carried out for obtaining the double-pi type filter as shown in FIG. 1.

The steps for obtaining an LC composite component are roughly divided into those for obtaining a laminated capacitor section and those for obtaining an inductance element section, the latter being performed after completion of the former.

Figure 3:
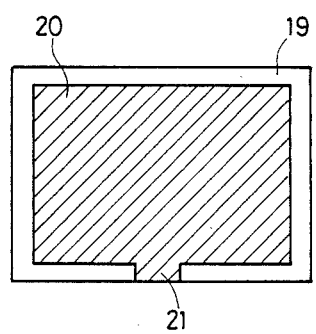

As shown in FIG. 3, a dielectric sheet 19 of ceramics is first prepared, formed on which is a conductive film 20 working as an inner electrode of a laminated capacitor, substantially over the entire surface thereof. The conductive film 20 has a drawn-out portion 21 extending toward the lower side of the dielectric sheet 19 in FIG. 3.

Figure 4:
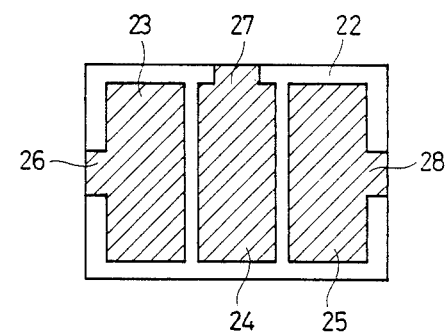
Figure 2:
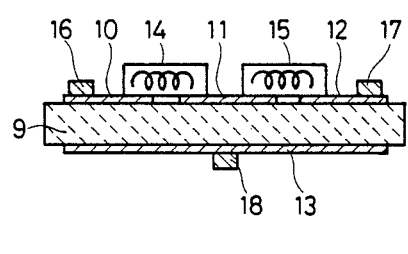
FIG. 2 is a cross-sectional view of a conventional LC composite component in the form of a double-pi type filter.

FIG. 4 in turn shows another dielectric sheet 22 of ceramics to be overlapped with the dielectric sheet 19 in FIG. 3. The subject dielectric sheet 22 is provided thereon with three conductive films 23, 24 and 25 formed in a laterally arranged manner to work as inner electrodes. The conductive film 23 has a drawn-out portion 26 extending toward the left-hand side of the dielectric sheet 22 in FIG. 4, while the conductive film 24 has a drawn-out portion 27 extending toward the upper side and the conductive film 25 has a drawn-out portion 28 extending toward the right-hand side.

Figure 6:
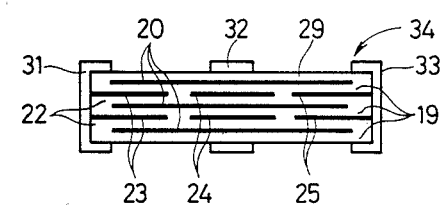

The dielectric sheets 19 and 22 are alternately laminated as shown in FIG. 6, and still another dielectric sheet 29 of ceramics is further laminated thereon. The substance thus laminated is subjected to firing in this condition. Thereafter the sintered substance thus obtained by firing is provided in its end surface with outer electrodes 30, 31, 32 and 33 at positions different from each other. The outer electrode 30 is connected with the drawn-out portion 21 of the conductive film 20 and the outer electrode 31 is connected with the drawn-out portion 26 of the conductive film 23, while the outer electrode 32 is connected with the drawn-out portion 27 of the conductive film 24 and the outer electrode 33 is connected with the drawn-out portion 28 of the conductive film 25.

In such a manner, a laminated capacitor section 34 is obtained. As illustrated in FIG. 7, formed in the laminated capacitor section 34 are three capacitance elements 35, 36 and 37, which respectively correspond to the respective capacitance elements 6, 7 and 8 shown in FIG. 1. The outer electrode 30 corresponds to the terminal 3, the outer electrode 31 corresponds to the terminal 1, and the outer electrode 33 corresponds to the terminal 2 respectively. The outer electrode 32 as shown in FIG. 7 corresponds to the point of interconnection of the two inductance elements 4 and 5 in FIG. 1, and consequently, starting from the outer electrode 32, a conductive path corresponding to the inductance elements 4 and 5 is formed as hereinafter described.

Figure 5:
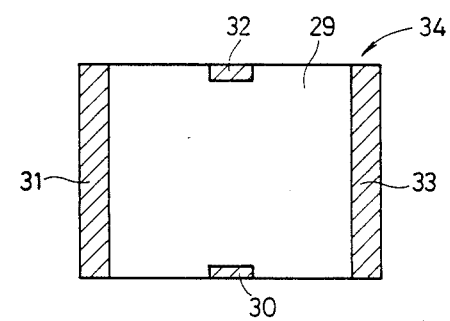

With reference to FIG. 8, a magnetic layer 38 is formed on the laminated capacitor section 34 obtained as shown in FIG. 5, in a state exposing at least the outer electrodes 30, 31, 32 and 33. The magnetic layer 38 is formed by printing of paste obtained by mixing sintered powder prepared by pulverizing sintered ferrite, glass frit of under 10% and organic binder.

With reference to FIG. 9, on the magnetic layer 38, there are formed two conductive patterns 39 and 40 to be partially overlapped on the outer electrode 32 and to extend therefrom. These conductive patterns 39 and 40 partially form a conductive path for producing an inductance component, and are formed by printing of mixed paste of powder of a metal such as silver, glass frit and organic binder.

With reference to FIG. 10, another magnetic layer 41 is formed on the subject magnetic layer 38. This magnetic layer 41 is prepared by the same material and the same method as the magnetic layer 38. The magnetic layer 41 is formed in a state exposing respective end terminals 39a and 40a of the respective conductive patterns 39 and 40.

With reference to FIG. 11, another two conductive patterns 42 and 43 are formed on the magnetic layer 41 to be partially overlapped on the respective end terminals 39a and 40a of the conductive patterns 39 and 40 and to extend therefrom. These conductive patterns 42 and 43 are formed in the same material and the same method as the above conductive patterns 39 and 40, to partially form the conductive path for producing an inductance component.

With reference to FIG. 12, still another magnetic layer 44 is formed in a state exposing respective end terminals 42a and 43a of the above conductive patterns 42 and 43. This magnetic layer 44 also is formed in the material and method similar to those of the respective magnetic layers 38 and 41.

Figure 13:
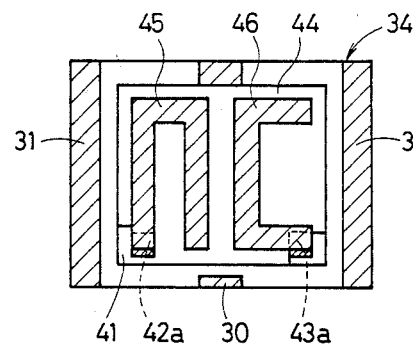

With reference to FIG. 13, still another two conductive patterns 45 and 46 are formed on the magnetic layer 44 to be partially overlapped on the respective end terminals 42a and 43a of the respective conductive patterns 42 and 43 and to extend therefrom, in a similar manner to the above. Also the conductive patterns 45 and 46 partially form the conductive path for producing an inductance component.

Figure 14:
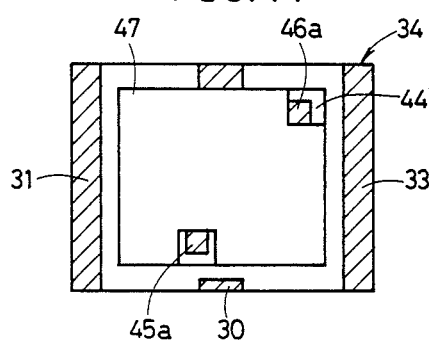

With reference to FIG. 14, a magnetic layer 47 is formed in a similar manner to the above, in a state exposing respective end terminals 45a and 46a of the conductive patterns 45 and 46.

Figure 15:
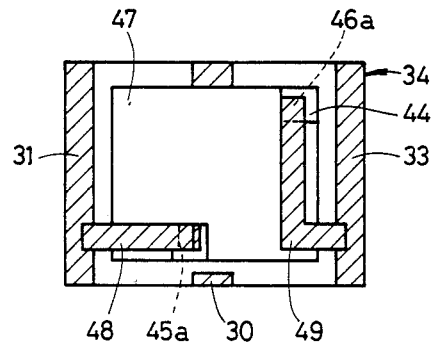

With reference to FIG. 15, further two conductive patterns 48 and 49 are formed to extend from the respective end terminals 45a and 46a of the conductive patterns 45 and 46 respectively toward the outer electrodes 31 and 33 of the laminated capacitor section 34.

Figure 16:
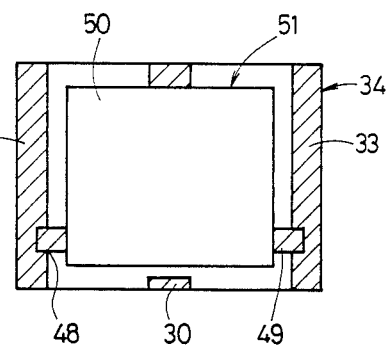

With reference to FIG. 16, a magnetic layer 50 is formed on the magnetic layer 47 in a similar manner to the other magnetic layers.

The laminated substance, as shown in FIG. 16, obtained by repeated formation of the magnetic layers and the conductive patterns on the laminated capacitor section 34 is fired at a temperature of, e.g., 600° C. to 850° C., whereby the glass frit contained in the magnetic layers and the conductive patterns is molten and solidified thereafter. Thus, an inductance element section 51 is integrally formed on the laninated capacitor section 34, thereby presenting a desired LC composite component.

Explaining the state of connection within the LC composite component with reference to FIG. 1, the terminals 1, 2 and 3 in FIG. 1 are respectively implemented by the outer electrodes 31, 33 and 30. The inductance element 4 is implemented by the conductive path obtained by connection of the conductive patterns 39, 42, 45 and 48 extending from the outer electrode 32. The inductance element 5 is implemented by a conductive path obtained by connection of the conductive patterns 40, 43, 44 and 49 extending from the outer electrode 32. The respective capacitance elements 6, 7 and 8 are implemented as shown in FIG. 7, as hereinabove described.

In the above described embodiment, the steps as shown in FIGS. 10 through 13 may further be repeated, to increase the number of lamination of the magnetic layers.

Figure 17:
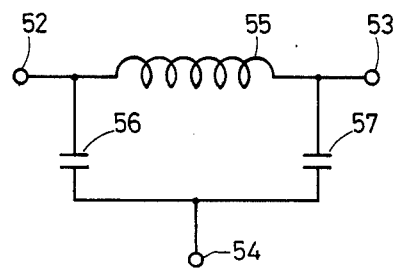
FIG. 17 is a connection diagram of a pi-type filter to be obtained by an LC composite component according to the present invention.

FIG. 17 is a connection diagram of a pi-type filter. The pi-type filter comprises three terminals 52, 53 and 54, in which an inductance element 55 is connected between the terminals 52 and 53 and two capacitance elements 56 and 57 are connected in parallel between the terminal 54 and the terminals 52 and 53. The steps for obtaining such a pi-type filter are hereafter described with reference to FIGS. 18 to 26.

Figure 18:
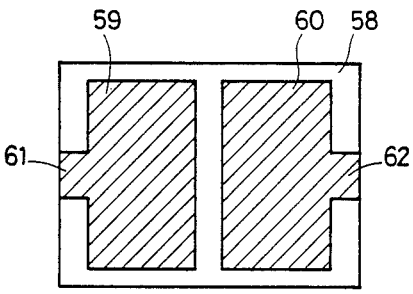
FIGS. 18 through 26 are illustrations of another embodiment of the present invention, in which steps for obtaining a pi-type filter are shown in order.

In FIG. 18, there is shown a dielectric sheet 58 of ceramics forming a section of a laminated capacitor section, on which two conductive films 59 and 60 are formed to work as inner electrodes. The conductive film 59 has a drawn-out portion 61 extending toward the left-hand side of the dielectric sheet 58 in FIG. 18, while the conductive film 60 has a drawn-out portion 62 extending toward the right-hand side.

Figure 19:
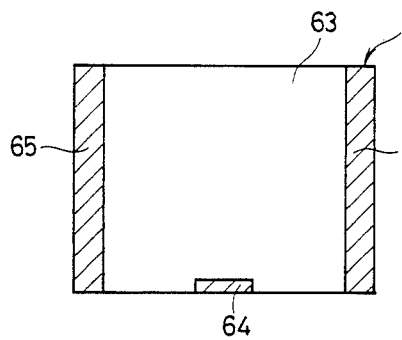

Also in this embodiment, the aforementioned dielectric sheet 19 as shown in FIG. 3 is used for forming the laminated capacitor section. That is, the dielectric sheet 19 shown in FIG. 3 and the dielectric sheet 58 shown in FIG. 18 are alternately laminated, and another dielectric sheet 63 of ceramics is further laminated thereon as shown in FIG. 19. The substance thus laminated is subjected to firing in a similar manner to the above described embodiment, whereafter outer electrodes 64, 65 and 66 are formed thereon at positions different from each other. In such a manner, there is obtained a laminated capacitor section 67 in this embodiment.

Formation of magnetic layers and conductive patterns is thereafter repeated in a similar manner to the aforementioned embodiment, and, since the material and method of forming of the same are similar to those in the above embodiment, the condition of formation of the same alone is hereafter explained.

Figure 20:
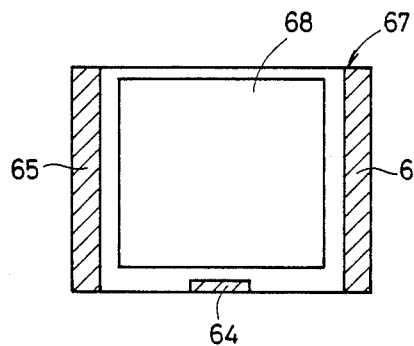

With reference to FIG. 20, a magnetic layer 68 is formed on the laminated capacitor section 67 in a state exposing at least the outer electrodes 64, 65 and 66.

Figure 21:
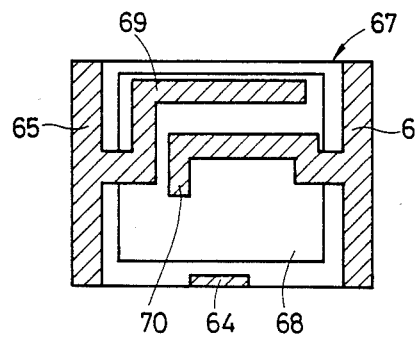

Then, as shown in FIG. 21, conductive patterns 69 and 70 are formed on the magnetic layer 68 respectively to extend from the respective outer electrodes 65 and 66.

Figure 22:
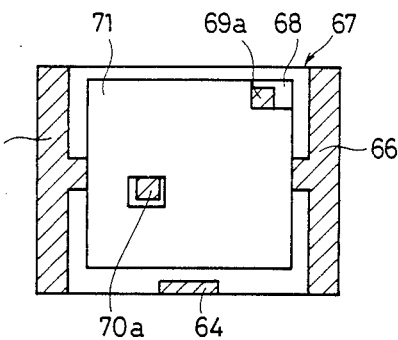

Then, as shown in FIG. 22, another magnetic layer 71 is formed in a state exposing respective end terminals 69a and 70a of the conductive patterns 69 and 70.

Figure 23:
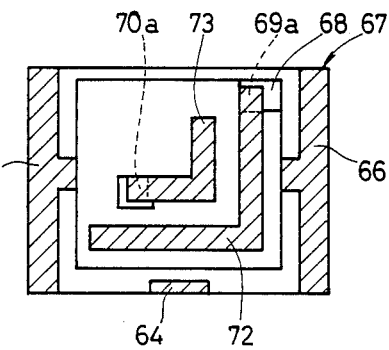

Then, as shown in FIG. 23, another two conductive patterns 72 and 73 are formed to be partially overlapped on the respective end terminals 69a and 70a of the conductive patterns 69 and 70 and to extend therefrom.

Figure 24:
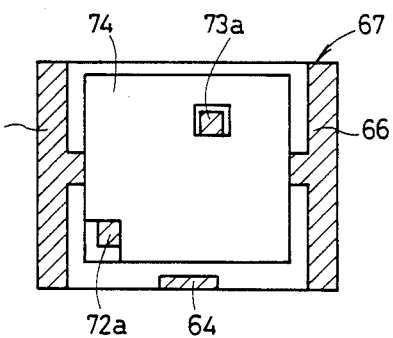

Then, as shown in FIG. 24, still another magnetic layer 74 is formed in a state exposing respective end terminals 72a and 73a of the above conductive patterns 72 and 73.

Figure 25:
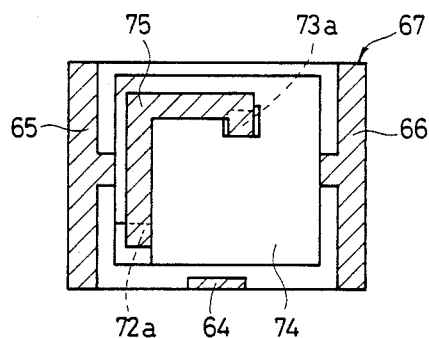

Then, as shown in FIG. 25, a further conductive pattern 75 is formed to interconnect the respective end terminals 72a and 73a of the conductive patterns 72 and 73 with each other.

Figure 26:
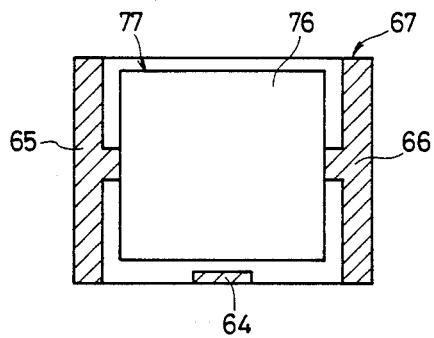

And then, as shown in FIG. 26, a still further magnetic layer 76 is formed on the magnetic layer 74 to cover the conductive pattern 75.

The substance obtained in FIG. 26 is fired under a relatively low temperature in a similar manner to the aforementioned embodiment, and an inductance element section 77 is solidified on the laminated capacitor section 67.

The LC composite component thus obtained and the connection of the pi-type filter as shown in FIG. 17 are in correspondence with each other as follows: The terminals 52, 53 and 54 in FIG. 17 respectively correspond to the outer electrodes 65, 66 and 64 in FIG. 26. The inductance element 55 is implemented by a conductive path formed by the conductive patterns 69, 72, 75, 73 and 70 extending from the outer electrode 65 to reach the outer electrode 66. The capacitance element 56 is formed between the conductive film 20 (FIG. 3) connected with the outer electrode 64 through the drawn-out portion 21 and the conductive film 59 connected with the outer electrode 65 through the drawn-out portion 61. The other capacitance element 57 is formed between the conductive film 20 (FIG. 3) connected with the outer electrode 64 and the conductive film 60 connected with the outer electrode 66 through the drawn-out portion 62.

Also in this embodiment, the steps as shown in FIGS. 22 and 23 may further be repeated to increase the number of lamination of the magnetic layers.

Figure 27:
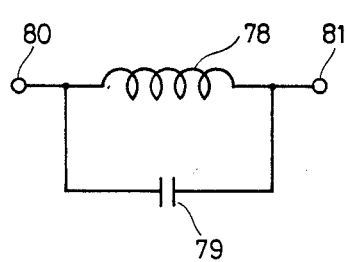
FIG. 27 is a connection diagram of still another LC composite component to be obtained by the present invention.
Figure 30:
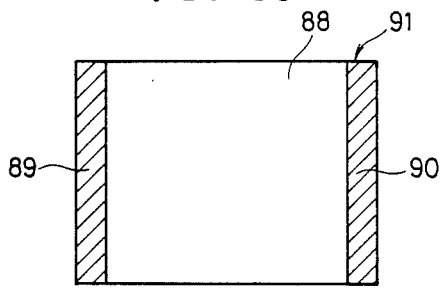

FIG. 27 is a connection diagram of an LC composite component in which an inductance element 78 is connected in parallel with a capacitance element 79 between two terminals 80 and 81. Such an LC composite component may be obtained by modifying the laminated capacitor section of the LC composite component implementing the above pi-type filter as shown in FIG. 17. Description is hereafter made on such modification.

Figure 28:
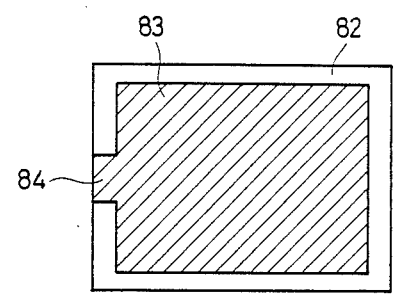
FIGS. 28 through 30 are illustrations of still another embodiment of the present invention, in which steps for obtaining the LC composite component in FIG. 27 are partially shown.

In FIG. 28, there is shown a dielectric sheet 82 of ceramics partially forming a laminated capacitor section. Formed on the dielectric sheet 82 is a conductive film 83 working as an inner electrode, which has a drawn-out portion 84 extending toward the left-hand side of the dielectric sheet 82 in FIG. 28.

Figure 29:
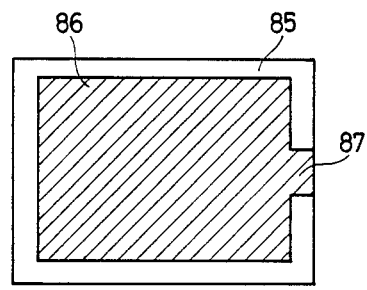

In FIG. 29, there is shown another dielectric sheet 85 of ceramics which is alternately overlapped with the above dielectric sheet 82. On the dielectric sheet 85, there is formed a conductive film 86 working as an inner electrode, which has a drawn-out portion 87 extending toward the right-hand side of the dielectric sheet 85 in FIG. 29.

The dielectric sheets 82 and 85 are alternately laminated, and still another dielectric sheet 88 of ceramics is further laminated thereon, whereafter the substance thus laminated is subjected to firing. Then, the sintered substance is provided in both ends thereof with outer electrodes 89 and 90 in such a manner that the outer electrode 89 is connected with the conductive film 86 through the drawn-out portion 84 and the other outer electrode 90 is connected with the conductive film 86 through the drawn-out portion 87. Thus, there is obtained a laminated capacitor section 91.

Then, an inductance element section is superposed on the laminated capacitor section 91, and the steps as shown in FIGS. 20 through 26 may intactly be carried out for obtaining the connection in a state as shown in FIG. 27. That is, the laminated capacitor section 91 may be substituted for the laminated capacitor section 67 in FIGS. 20 to 26 and the outer electrodes 89 and 90 may be substituted for the outer electrodes 65 and 66 for carrying out the steps.

In the LC composite component thus obtained, the outer electrodes 89 and 90 form the terminals 80 and 81 in FIG. 27 and the conductive patterns 69, 62, 75, 73 and 70 shown in FIGS. 21 to 25 are connected between the outer electrodes 89 and 90 to form the inductance element 78, while the capacitance element 79 is formed by the conductive film 83 connected with the outer electrode 89 and the conductive film 86 connected to the outer electrode 90.

Figure 31:
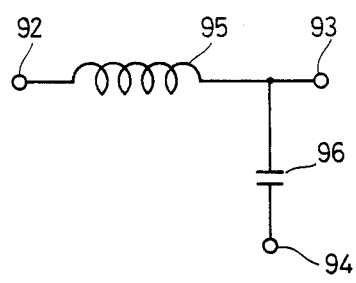
FIG. 31 is a connection diagram of a further LC composite component to be obtained by the present invention.

FIG. 31 is a connection diagram of still another LC composite component. The LC composite component comprises three terminals 92, 93 and 94, an inductance element 95 connected between the terminals 92 and 93 and a capacitance element 96 connected between the terminals 93 and 94.

Figure 32:
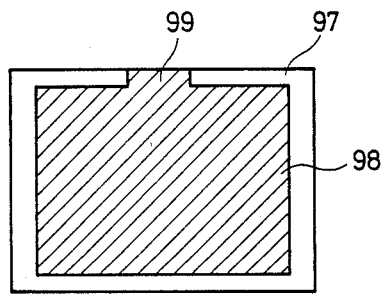

In FIG. 32, there is shown a dielectric sheet 97 of ceramics which is utilized to partially form a laminated capacitor section implementing the capacitance element 96 in the LC composite component as shown in FIG. 31. Formed on the dielectric sheet 97 is a conductive film 98 working as an inner electrode, which has a drawn-out portion 99 extending toward the upper side of the dielectric sheet 97 in FIG. 32.

Figure 33:
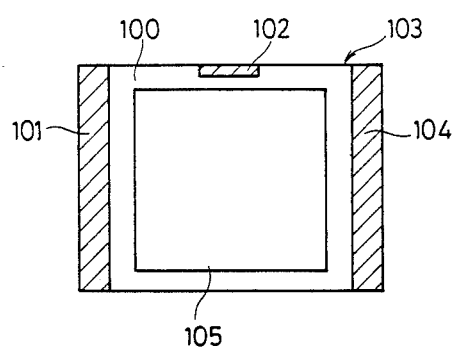
FIGS. 32 and 33 are illustrations of a further embodiment of the present invention, in which steps for obtaining the LC composite component in FIG. 31 are partially shown.

For obtaining the laminated capacitor section, the dielectric sheet 97 is alternately laminated with, e.g., the dielectric sheet 82 as shown in FIG. 28. Another dielectric sheet 100 of ceramics as shown in FIG. 33 is further laminated thereon, and the substance thus laminated is subjected to firing, whereafter outer electrodes 101 and 102 are formed. The outer electrode 101 is connected with the conductive film 83 (FIG. 28) through the drawn-out portion 84, while the other outer electrode 102 is connected with the conductive film 98 (FIG. 32) through the drawn-out portion 99. Thus, there is obtained a laminated capacitor section 103 having the outer electrodes 101 and 102.

On the laminated capacitor section 103, there further is formed another outer electrode 104. This outer electrode 104 is not connected with the inner electrode of the laminated capacitor section 103. The laminated capacitor section 103 is further provided thereon with a magnetic layer 105 in a state exposing at least the outer electrodes 101 and 104.

For finally obtaining the LC composite component as shown in FIG. 31 with utilization of the substance shown in FIG. 33, formation of conductive patterns and magnetic layers may be carried out in a similar manner to the steps as shown in FIGS. 21 to 26. That is, the laminated capacitor section 103 shown in FIG. 33 may be substituted for the laminated capacitor section 67 in FIG. 21 and the outer electrodes 101 and 104 may be substituted for the outer electrodes 65 and 66 for carrying out the steps shown in FIGS. 21 to 26.

With respect to the relation between the LC composite component thus obtained and the connection in the state as shown in FIG. 31, the terminals 92, 93 and 94 respectively correspond to the outer electrodes 104, 101 and 102. The inductance element 95 is formed by the conductive patterns 69, 72, 75, 73 and 70 as shown in FIGS. 21 to 25, extending between the outer electrodes 101 and 104. The capacitance element 96 is implemented by the conductive film 83 in FIG. 28 which is connected with the outer electrode 101 and the conductive film 98 in FIG. 32 which is connected with the outer electrode 102.

It is to be noted that the present invention hereinabove described with respect to various embodiments may further be modified in various ways.

For example, although magnetic layers are used at the portion forming the inductance element section, the layers may be formed by insulating material such as alumina in a case where the inductance value required is not very high. In this case, the laminated substance forming the inductance element section is prepared by solidifying paste containing sintered powder of insulating ceramic material such as alumina. When such insulating material is used as the inductance element section, the magnetic layers 38, 68 and 105 (practically insulating layers in this case) in the above respective embodiments are not necessarily required since the dielectric sheets are disposed directly under the same, and these magnetic layers (insulating layers) may be omitted. It is to be noted that magnetic leakage may effectively be prevented by forming the uppermost magnetic layer and the lowermost magnetic layer in the inductance element section actually by magnetic material.

In a case where the insulating capacity of the magnetic layers in the inductance element section is not sufficiently high, insulating paste films may be printed between the conductive patterns and the magnetic layers to add insulating layers, if necessary.

Although silver is herein suggested as the material for forming the conductive patterns in the inductance element section, they may be formed by any other metal. In other words, there is no need to use an expensive noble metal resistant to a high temperature as the material for the conductive patterns.

It is to be noted that the forms of the conductive films and patterns in the illustrated embodiments are shown by way of example only, and they may be modified in various other forms.

Although the present invention has been described and illustrated in detail, it is clearly understood that the same is by way of illustration and example only and is not to be taken by way of limitation, the scope of the present invention being limited only by the terms of the appended claims.

What is claimed is:

1. An LC composite component comprising:
   a laminated capacitor section provided on its end surface with at least two outer electrodes at positions different from each other;
   an inductance element section superposed on said laminated capacitor section; and
   a conductive path formed within said inductance element section, said conductive path extending from a predetermined outer electrode of said laminated capacitor section, wherein said inductance element section includes a laminated substance comprising a plurality of layers obtained by solidifying paste containing sintered powder of magnetic or insulating ceramic material, said conductive path includes a plurality of conductive patterns formed on said plurality of layers in said laminated substance, and said plurality of conductive patterns extend within said inductance element section such that certain layers of said laminated substance are laminated in a state exposing end terminals of the conductive patterns arranged under the same, said conductive patterns arranged under the same being conductively connected with the conductive patterns formed on said layers at the exposed faces, thereby to produce an inductance component.

2. An LC composite component in accordance with claim 1, wherein said laminated capacitor section is provided with first to third capacitance elements, said outer electrodes include first to third outer electrodes and said inductance element section is provided with first and second inductance elements, said first and second inductance elements being connected in series between said first and second outer electrodes, and respective one terminals of said first to third capacitance elements are connected in common with said third outer electrode and respective other terminals of said first to third capacitance elements are respectively connected with said first outer electrode, the junction between said first and second inductance elements and said second outer electrode.

3. An LC composite component in accordance with claim 2, wherein said laminated capacitor section is formed by alternately laminating a first dielectric sheet provided with a first inner electrode substantially over the entire surface and a second dielectric sheet provided with mutually divided second to fourth inner electrodes.

4. An LC composite component in accordance with claim 3, wherein said first inner electrode is connected with said third outer electrode, said second and fourth inner electrodes are respectively connected with said first and second outer electrodes, and starting from said third inner electrode, respective conductive paths of said first and second inductance elements respectively extend to said first and second outer electrodes.

5. An LC composite component in accordance with claim 1, wherein said laminated capacitor section is provided with first and second capacitance elements, said outer electrodes include first to third outer electrodes and said inductance element section is provided with an inductance element, said inductance element being connected between said first and second outer electrodes, and respective one terminals of said first and second capacitance elements are connected in common with said third outer electrode and respective other terminals of said first and second capacitance elements are respectively connected with said first and second outer electrodes.

6. An LC composite component in accordance with claim 5, wherein said laminated capacitor section is formed by laminating a first dielectric sheet provided with a first inner electrode substantially over the entire surface and a second dielectric sheet provided with mutually divided second and third inner electrodes.

7. An LC composite component in accordance with claim 6, wherein said first inner electrode is connected with said third outer electrode, said second and third inner electrodes are respectively connected with said first and second outer electrodes and the conductive path of said inductance element extends between said first and second outer electrodes.

8. An LC composite component in accordance with claim 1, wherein said laminated capacitor section is provided with a capacitance element, said outer electrodes include first and second outer electrodes and said inductance element section is provided with an inductance element, said capacitance element and said inductance element being connected in parallel between said first and second outer electrodes.

9. An LC composite component in accordance with claim 8, wherein said laminated capacitor section is formed by alternately laminating first and second dielectric sheets respectively provided with first and second inner electrodes substantially over the entire surfaces.

10. An LC composite component in accordance with claim 9, wherein said first and second inner electrodes are respectively connected with said first and second outer electrodes, and the conductive path of said inductance element extends between said first and second outer electrodes.

11. An LC composite component in accordance with claim 1, wherein said laminated capacitor section is provided with a capacitance element, said outer electrodes include first to third outer electrodes and said inductance element section has an inductance element, said capacitance element being connected between said first and second outer electrodes, and said inductance element is connected between said second and third outer electrodes.

12. An LC composite component in accordance with claim 11, wherein said laminated capacitor section is formed by alternately laminating first and second dielectric sheets respectively provided with first and second inner electrodes substantially over the entire surfaces.

13. An LC composite component in accordance with claim 12, wherein said first and second inner electrodes are respectively connected with said first and second outer electrodes, and the conductive path of said inductance element extends between said second and third outer electrodes.

14. An LC composite component in accordance with claim 1, wherein said laminated substance of said inductance element section contains ferrite.

15. An LC composite component in accordance with claim 14, wherein said laminated substance of said inductance element section comprises layers obtained by firing paste containing sintered ferrite, glass frit and organic binder and solidifying the same.

16. An LC composite component in accordance with claim 1, wherein said laminated substance of said inductance element section contains alumina.

* * * * *